(12) United States Patent
Kitagawa

(10) Patent No.: US 7,072,157 B2
(45) Date of Patent: Jul. 4, 2006

(54) ELECTROSTATIC DISCHARGE PROTECTION CIRCUIT DEVICE

(75) Inventor: Nobutaka Kitagawa, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 10/671,585

(22) Filed: Sep. 29, 2003

(65) Prior Publication Data
US 2004/0141269 A1    Jul. 22, 2004

(30) Foreign Application Priority Data
Jan. 20, 2003   (JP) .............................. 2003-011175

(51) Int. Cl.
*H02H 9/00* (2006.01)
(52) U.S. Cl. .......................... 361/56; 361/111; 361/118
(58) Field of Classification Search .................. 361/56, 361/118
See application file for complete search history.

(56) References Cited

U.S. PATENT DOCUMENTS

| 5,079,612 A | | 1/1992 | Takamoto et al. |
| 5,821,804 A | * | 10/1998 | Nikutta et al. ............... 327/382 |
| 6,947,267 B1 | * | 9/2005 | Liu et al. ....................... 361/56 |

OTHER PUBLICATIONS

M.-D. Ker, et al., IEEE Journal of Solid-State Circuits, vol. 32, No. 1, pp. 38-51, "A Gate-Coupled PTLSCR/NTLSCR ESD Protection Circuit for Deep-Submicron Low-Voltage CMOS IC'S", Jan. 1997.

* cited by examiner

*Primary Examiner*—Phuong T. Yu
*Assistant Examiner*—Dharti H. Patel
(74) *Attorney, Agent, or Firm*—Oblon, Spivak, McClelland, Maier & Neustadt, P.C.

(57) ABSTRACT

An electrostatic discharge protection circuit device is disclosed, which comprises a first electrostatic discharge protection circuit connected between a first external terminal and a first ground terminal, a second electrostatic discharge protection circuit connected between a second external terminal and a second ground terminal, the second electrostatic discharge protection circuit having substantially the same configuration as that of the first electrostatic discharge protection circuit, a trigger signal line which connects to each other output nodes of surge detection circuits of the first and second electrostatic discharge protection circuits, and transfers a surge detection output of the first or second electrostatic discharge protection circuit to the other electrostatic discharge protection circuit as a trigger signal, and a common discharge line connected directly to the first ground terminal, connected to the second ground terminal via a parallel circuit composed of a forward-connected parasitic diode element and a reverse-connected parasitic diode element.

31 Claims, 8 Drawing Sheets

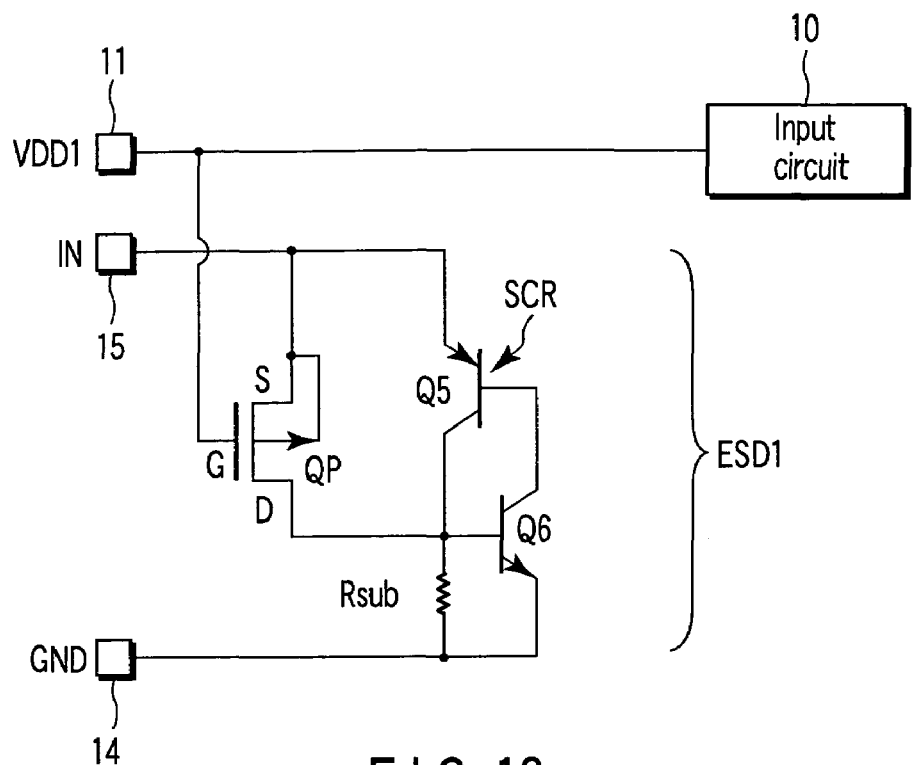
F I G. 12
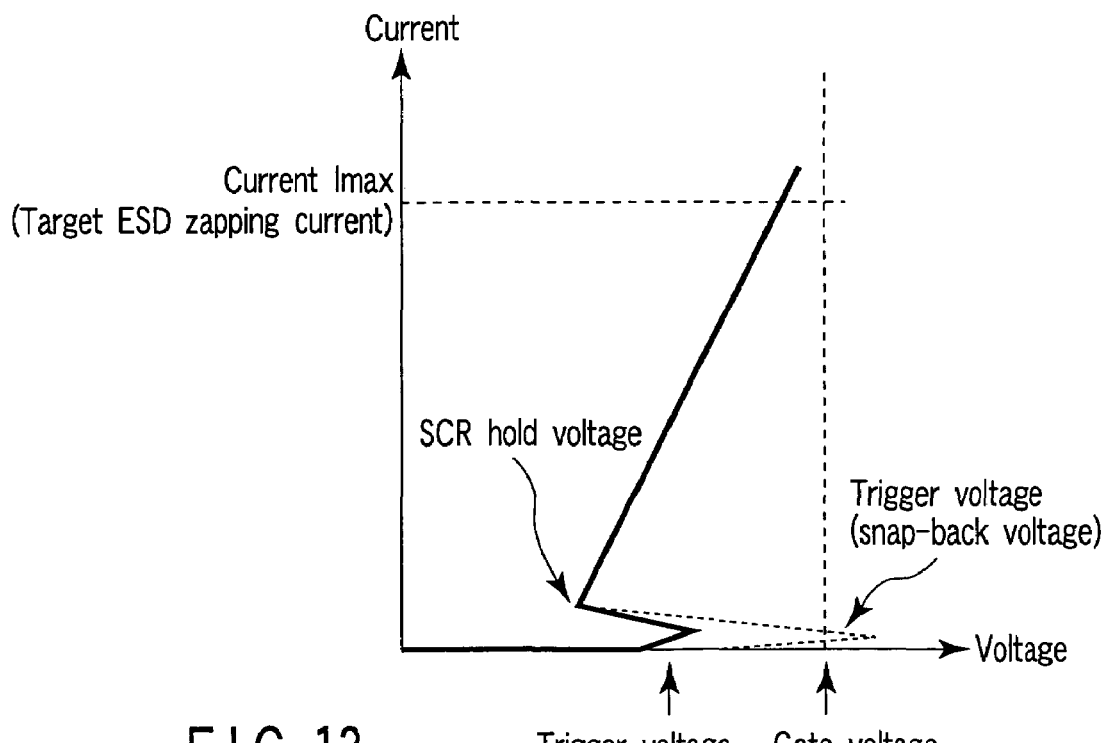
F I G. 13

ELECTROSTATIC DISCHARGE PROTECTION CIRCUIT DEVICE

CROSS-REFERENCE TO RELATED APPLICATIONS

This application is based upon and claims the benefit of priority from the prior Japanese Patent Application No. 2003-011175, filed Jan. 20, 2003, the entire contents of which are incorporated herein by reference.

BACKGROUND OF THE INVENTION

1. Field of the Invention

The present invention relates to a semiconductor device, and in particular to an ESD (Electrostatic Discharge) protection circuit device incorporated in a semiconductor device in order to protect an input circuit, an output circuit, etc., of the semiconductor device from being destroyed by ESD. For example, the present invention is applied to an ESD protection circuit using an SCR (Silicon Controlled Rectifier) as a voltage clamp element for ESD protection in a CMOS LSI of low power supply voltage type.

2. Description of the Related Art

For example, in some ESD protection circuits each provided to protect an input circuit and an output circuit of an CMOS LSI from ESD destruction, diodes, transistors or SCRs are used as protection elements.

In an ESD protection circuit using an SCR, operation voltage of the SCR is typically high. In the case where the ESD protection circuit using an SCR is incorporated in a fine CMOS LSI in which the voltage of the operation power supply is made lower, therefore, a low voltage trigger needs to be made possible in order to protect MOS transistors having a low gate breakdown voltage in the CMOS LSI.

From such a background, an example in which an ESD protection circuit using an SCR is incorporated in a CMOS LSI of low power supply voltage type is disclosed in "A Gate-Coupled PTLSCR/NTLSCR ESD Protection Circuit for Deep-Submicron Low-Voltage CMOS IC's 1", IEEE JOURNAL OF SOLID-STATE CIRCUITS, VOL. 32, NO. 1, JANUARY 1997.

FIG. 9 is an equivalent circuit diagram showing a principal part of an ESD protection circuit connected to an input circuit of the CMOS LSI disclosed in the above-described document. In FIG. 9, an example (conventional-art example 1) in which LVTSCRs (Low-Voltage Triggered lateral SCR) are used as the SCRs in the ESD protection circuits is shown.

In FIG. 9, a first ESD protection circuit 121 is connected between an input pad PAD connected to internal circuits and a VDD node, to which a power supply potential VDD is applied, and a second ESD protection circuit 122 is connected between the input pad PAD and ground potential VSS (GND).

In the first ESD protection circuit 121, a first SCR LVTSCR1 is connected between the VDD node and the input pad PAD at its anode and cathode, respectively. A collector-base junction of an NPN transistor Q2 is connected in parallel with a base-collector junction of a PNP transistor Q1. An emitter of the PNP transistor Q1 serves as an anode of the SCR, and an emitter of the NPN transistor Q2 serve as a cathode of the SCR.

A PMOS transistor Mp1 having a gate oxide film formed so as to become thin is connected between the VDD node and the base of the NPN transistor Q2 at its source S and drain D, respectively. A gate of the PMOS transistor Mp1 is connected to the VDD node.

A well resistor Rw1 is connected between the VDD node and a node coupled to the base of the PNP transistor Q1 and a collector (N-well) of the transistor Q2. A well resistor Rw2 is connected between the emitter of the NPN transistor Q2 and the input PAD. A substrate resistor Rsub1 is connected between the GND and a node coupled to the collector of the PNP transistor Q1 and the base (P-Sub) of the transistor Q2.

In the second ESD protection circuit 122, a second SCR LVTSCR2 is connected between the GND node and the input pad PAD at its anode and cathode, respectively. A collector-base junction of an NPN transistor Q4 is connected in parallel with a base-collector junction of a PNP transistor Q3. An emitter of the PNP transistor Q3 serves as an anode of the SCR, and an emitter of the NPN transistor Q4 serve as a cathode of the SCR.

An NMOS transistor Mn1 having a gate oxide film formed so as to become thin is connected between the base of the PNP transistor Q3 and the emitter of the NPN transistor Q4 at its drain D and source S, respectively. A gate of the NMOS transistor Mn1 is connected to the GND node.

A well resistor Rw3 is connected between the VDD node and a node coupled to the base of the PNP transistor Q3 and a collector (N-well) of the NPN transistor Q4. A substrate resistor Rsub2 is connected between the GND and the base (substrate region of NMOS transistor TN) of the NPN transistor Q4.

If a voltage equal to at least a snap-back breakdown voltage is applied to an LVTSCR2 included in the second ESD protection circuit 122 shown in FIG. 9 when a surge voltage of a positive polarity is input to the input pad PAD, then the LVTSCR2 turns on with a snap-back current serving as a base current, and a surge current is discharged to GND, thus the input gate of the input circuit is protected.

If the voltage applied to the LVTSCR2 equal to at least the snap-back breakdown voltage is higher than a gate breakdown voltage of an NMOS transistor Mn1, however, there is a problem that the internal circuits are damaged by a surge voltage input.

FIG. 10 is a circuit diagram showing a principal part of a different ESD protection circuit disclosed in the above-described document. An example (conventional-art example 2) in which low-voltage triggered lateral SCRs using a gate coupling technique are used as SCRs in the ESD protection circuits is shown.

In FIG. 10, a first ESD protection circuit 151 is the same as the first ESD protection circuit 121 shown in FIG. 9 except the following points (1) to (4). Therefore, the same components are denoted by like characters, and description thereof will be omitted.

(1) Instead of the LVTSCR1 shown in FIG. 9, a PTLSCR (PMOS-Triggered lateral SCR in which an SCR is triggerable by a PMOS transistor) is used.

(2) A PMOS transistor Mp1 is connected in parallel between the VDD node and a gate node of the PTLSCR (the base of the NPN transistor Q2) at its source and drain, respectively.

(3) A resistor element Rp is connected between the VDD node and a gate of the PMOS transistor Mp1.

(4) A capacitance element Cp is connected between the gate of the PMOS transistor Mp1 and the input pad PAD.

Similarly, a second ESD protection circuit 152 is the same as the second ESD protection circuit 122 shown in FIG. 9 except the following points (1) to (4). Therefore, the same components are denoted by like characters, and description thereof will be omitted.

(1) Instead of the LVTSCR2 shown in FIG. 9, an NTLSCR (NMOS-Triggered lateral SCR in which an SCR is triggerable by an NMOS transistor) is used.

(2) An NMOS transistor Mn1 is connected in parallel between a gate node of the NTLSCR (the base of the PNP transistor Q3) and a cathode (the emitter of the NPN transistor Q4) at its drain and source, respectively.

(3) A capacitance element Cn is connected between the input pad PAD and the gate of the NMOS transistor Mn1.

(4) A resistor element Rn is connected between a gate of the NMOS transistor Mn1 and the GND node.

When a surge voltage of a negative polarity is input to the input pad PAD in the above-described configuration, the PMOS transistor Mp1 in the first ESD protection circuit 151 using the PTLSCR transitionally turns on to give a trigger to the PTLSCR. As a result, the surge current is absorbed to the VDD node, and the input gate of the input circuit is protected. After a predetermined time based on a time constant determined by the resistor element Rp and the capacitance element Cp has elapsed, the PMOS transistor Mp1 returns to the off-state.

When a surge voltage of a positive polarity is input to the input pad PAD in the above-described configuration, the NMOS transistor Mn1 in the second ESD protection circuit 152 using the NTLSCR transitionally turns on to give a trigger to the NTLSCR. As a result, the surge current is absorbed to the GND node, and the input gate of the input circuit is protected. After a predetermined time based on a time constant determined by the resistor element Rn and the capacitance element Cn has elapsed, the NMOS transistor Mn1 returns to the off-state.

In Jpn. Pat. Appln. KOKAI Publication No. 8-321586, a technique for attaching a protection element to a common discharge line in a multi-power supply LSI is disclosed. However, it is necessary to prepare the common discharge line apart from the power supply line and the ground line. It is not favorable because a large area is occupied on an LSI chip.

In Jpn. Pat. Appln. KOKOKU Publication No. 6-5705, a technique of disposing a protection element so as to form a current path between a ground line of the circuit having a maximum area and a signal line and a power supply line.

In the convention ESD protection circuit using an SCR, however, a trigger is applied by using a transitional potential change caused when a surge voltage is input to the input pad to which SCRs are connected, and this results in a problem that favorite protection characteristics are not necessarily obtained.

In order to solve this problem, the present inventors have proposed, in Japanese Patent Application No. 2002-118253 entitled "Semiconductor device," a semiconductor device that can implement favorable protection characteristics with a low voltage trigger and improve the reliability, in the case where an ESD protection circuit using an SCR is applied to an LSI advanced in lowering the power supply voltage.

FIG. 11 is a circuit diagram in the case where an ESD protection circuit using an SCR is applied to a CMOS LSI that is an example of a semiconductor device according to the above-described proposal.

This semiconductor device includes a first external terminal to which a first power supply voltage is supplied at the time of ordinary operation, a second external terminal and a third external terminal electrically isolated from the first external terminal, an SCR for ESD protection connected between the second external terminal and the third external terminal respectively at its anode and cathode and including a PNP transistor and an NPN transistor, and a PMOS transistor for SCR trigger connected between the second external terminal and a base of the NPN transistor respectively at its source and drain, connected to a substrate region at its source, and electrically connected to the first external terminal at its gate.

FIG. 12 is an equivalent circuit diagram showing a first ESD protection circuit taken out from the semiconductor device shown in FIG. 11.

The ESD protection circuit is connected between an input pad PAD 15 connected to an input circuit 10 of a CMOS LSI and a GND pad 14 and comprises an SCR for ESD protection. The SCR is connected between the input pad PAD 15 and the GND pad 14 at its anode and cathode thereof, respectively. A collector-base junction of an NPN transistor Q6 is connected in parallel with a base-collector junction of a PNP transistor Q5. An emitter of the PNP transistor Q5 serves as an anode of the SCR, and an emitter of the NPN transistor Q6 serve as a cathode of the SCR. A substrate resistor Rsub is connected between the base of the NPN transistor Q6 and GND.

A PMOS transistor QP for trigger input is connected between the input pad 15 and the base of the NPN transistor Q6 at its source S and drain D, respectively. A gate of the PMOS transistor QP is connected to the VDD1 pad 11. A source of the PMOS transistor QP is connected to the substrate region. A diode for reverse current absorption (D in FIG. 11), which is forward biased when the SCR is applied with a reverse voltage, is connected in parallel with the SCR.

In the circuit structure of FIG. 12, in such a state that the surge voltage input poses a problem, a normal power supply potential VDD1 is not yet applied to the VDD1 pad 11, and the gate of the PMOS transistor QP for trigger input has the ground potential.

Thus, in this state, when a surge voltage of positive polarity is input to the input pad 15, the PMOS transistor QP turns on, if a forward bias voltage greater in absolute value than a gate threshold voltage Vthp of the PMOS transistor QP is applied between the gate and source of the PMOS transistor QP. As a result, a trigger is applied to the thyristor SCR, and the thyristor SCR turns on. Thus, a surge current is discharged to the ground, and the input gate of the input circuit 10 is protected. Since the absolute value of a gate threshold voltage Vthp of a PMOS transistor QP is small, it becomes possible to start an SCR with a low voltage trigger.

FIG. 13 is a characteristic diagram schematically showing voltage-current characteristics of an SCR in the semiconductor device shown in FIG. 11.

The characteristics show how the ESD current is flown by inputting a trigger voltage lower than the breakdown voltage of an SCR in a region of at least the holding voltage of the SCR.

If the ESD protection circuit including an SCR for ESD protection and a PMOS transistor for SCR trigger as described above is incorporated, for example, between power supply pads and between signal pads in a semiconductor device using multiple power supplies, then an area occupied by a pattern of a large number of ESD protection circuits on a chip remarkably increases, resulting in an increase of the chip size.

BRIEF SUMMARY OF THE INVENTION

According to an aspect of the present invention, there is provided an electrostatic discharge protection circuit device comprising:

a first electrostatic discharge protection circuit connected between a first external terminal supplied with a first power supply voltage at time of ordinary operation and a first ground terminal;

a second electrostatic discharge protection circuit connected between a second external terminal supplied with a second power supply voltage at the time of the ordinary operation and a second ground terminal, the second electrostatic discharge protection circuit having substantially the same configuration as that of the first electrostatic discharge protection circuit;

a trigger signal line which connects to each other output nodes of surge detection circuits of the first and second electrostatic discharge protection circuits, and transfers a surge detection output of one of the first and second electrostatic discharge protection circuits to the other electrostatic discharge protection circuit as a trigger signal; and a common discharge line connected directly to the first ground terminal, connected to the second ground terminal via a parallel circuit composed of a forward-connected parasitic diode element and a reverse-connected parasitic diode element, and used commonly by the first and second of electrostatic discharge protection circuits.

According to another aspect of the present invention, there is provided an electrostatic discharge protection circuit device comprising:

a first electrostatic discharge protection circuit connected between a first external terminal supplied with a first power supply voltage at time of ordinary operation and a first ground terminal;

a plurality of second electrostatic discharge protection circuits each connected between a corresponding second external terminal supplied with a corresponding second power supply voltage at the time of the ordinary operation and a corresponding second ground terminal, each of the second electrostatic discharge protection circuits having substantially the same configuration as that of the first electrostatic discharge protection circuit;

a trigger signal line which connects in common an output node of a surge detection circuit of the first electrostatic discharge protection circuit and output nodes of surge detection circuits of the second electrostatic discharge protection circuits, and transfers a surge detection output of the first electrostatic discharge protection circuit and a surge detection output of one of the second electrostatic discharge protection circuits to the other electrostatic discharge protection circuits as a trigger signal; and a common discharge line connected directly to the first ground terminal, connected to the second ground terminals via a parallel circuit composed of a forward-connected parasitic diode element and a reverse-connected parasitic diode element, and used commonly by the first electrostatic discharge protection circuit and the second of electrostatic discharge protection circuits.

BRIEF DESCRIPTION OF THE SEVERAL VIEWS OF THE DRAWING

FIG. 12 is an equivalent circuit diagram showing a first ESD protection circuit shown in FIG. 11; and FIG. 13 is a characteristic diagram schematically showing voltage-current characteristics of SCRs shown in FIG. 11.

DETAILED DESCRIPTION OF THE INVENTION

Hereafter, embodiments of the present invention will be described in detail with reference to the drawings.

In the following embodiments, a plurality of pads is formed on one semiconductor chip (LSI chip). When the semiconductor chip is packaged, the pads are connected to external connection terminals (such as pins and bump electrodes) of a semiconductor device.

<First Embodiment>

Figure 1:
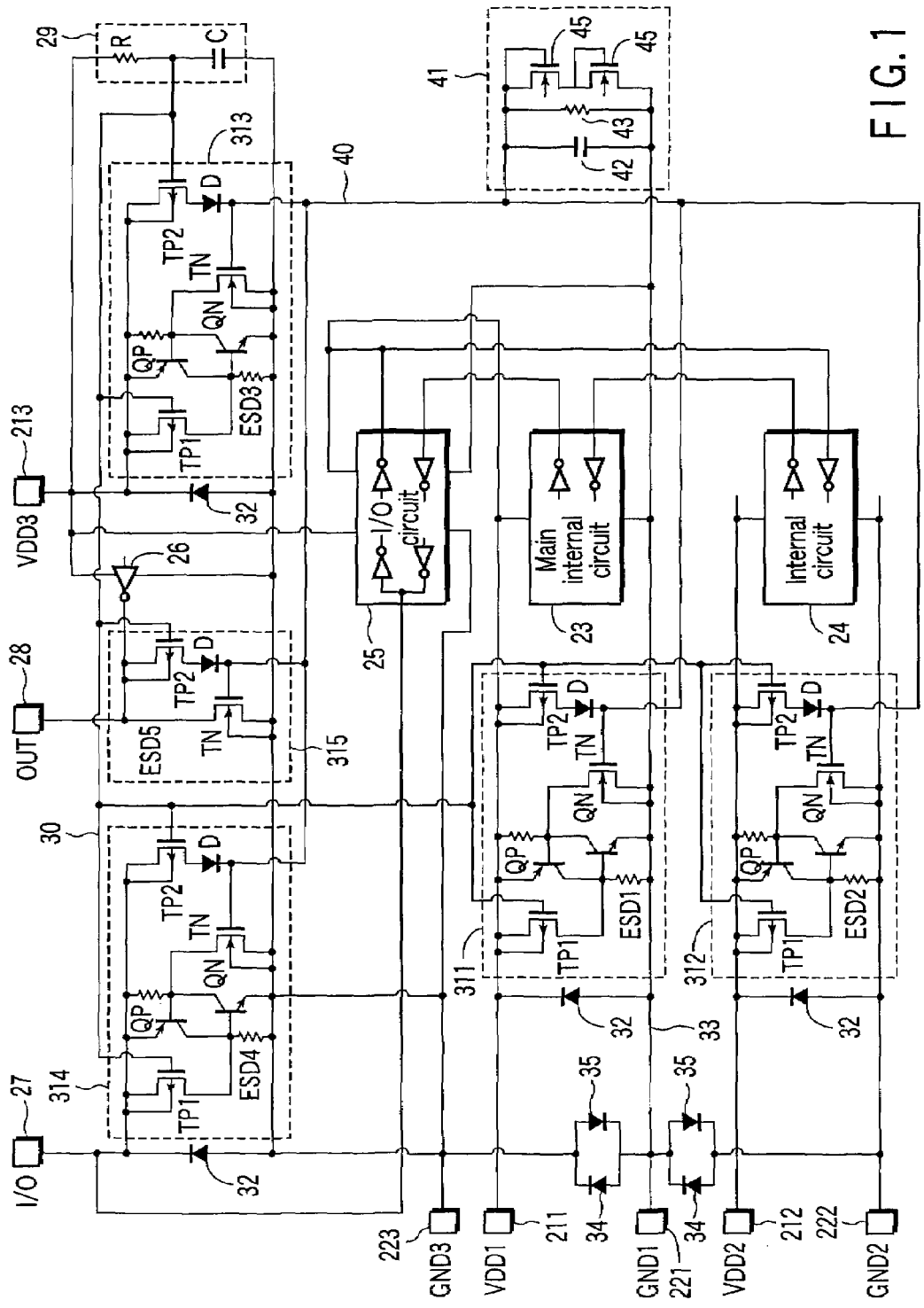
FIG. 1 is a circuit diagram showing a part of a CMOS LSI incorporating ESD protection circuit devices each using an SCR according to a first embodiment of the present invention.

FIG. 1 is a circuit diagram showing a part of a CMOS LSI incorporating ESD protection circuit devices each using an SCR according to a first embodiment of the present invention.

In FIG. 1, reference numeral 211 denotes a VDD1 pad to which a first power supply potential VDDI is applied at the time of ordinary operation, and 221 denotes a GND1 pad to which a first ground potential GND1 is supplied. Reference numeral 212 denotes a VDD2 pad to which a second power supply potential (such as, for example, 1.5 V) is applied at the time of ordinary operation, and 222 is a GND2 pad to which a second ground potential GND2 is applied. Reference numeral 213 denotes a VDD3 pad to which a third power supply potential VDD3 is applied at the time of ordinary operation, and 223 denotes a GND3 pad to which a third ground potential GND3 is applied.

In the present embodiment, a power supply voltage for LS (such as, for example 1.5 V) obtained by down-converting an external power supply input is applied as the VDD1, and, for example, 2.5 V obtained by down-converting the external power supply input is applied as the VDD2, whereas, for example, 3.3 V (highest potential), which is the external power supply input, is applied as the VDD3.

Main internal circuits 23 and a first ESD protection circuit (ESD1) 311 are connected between the VDD1 pad 211 and the GND1 pad 221. Internal circuits 24 and a second ESD protection circuit (ESD2) 312 are connected between the VDD2 pad 212 and the GND2 pad 222. An input/output (I/O) circuit 25, an ordinary output buffer circuit 26, and a third ESD protection circuit (ESD3) 313 are connected between the VDD2 pad 213 and the GND3 pad 223.

An I/O pad 27 for signal input/output electrically separated from the VDD1 pad 211 to the VDD3 pad 213 is connected to input and output terminals of the I/O circuit 25. A fourth ESD protection circuit (ESD4) 314 is connected between the I/O pad 27 and the GND3 pad 223.

An output (OUT) pad 28 electrically separated from the VDD1 pad to the VDD3 pad is connected to an output end of the output buffer circuit 26. A fifth ESD protection circuit (ESD5) 315 is connected between the output pad 28 and the GND3 pad 223.

In addition, an integration circuit 29 composed of a series circuit of a resistor element R and a capacitance element C is connected between the VDD3 pad 213, to which the highest potential is applied and the GND3 pad 223. An output node (a series connection node for R and C) of the integration circuit 29, gates of trigger elements in the first ESD protection circuit 311 to the fourth ESD protection circuit 314, and gates of surge detection elements in the first ESD protection circuit 311 to the fifth ESD protection circuit 315 are connected in common by a trigger bias line 30.

A trigger signal line 40 is formed. The signal line 40 connects surge detection output nodes of the first ESD protection circuit 311 to the fifth ESD protection circuit 315 to each other, and transfers a surge detection output of one of the first ESD protection circuit 311 to the fifth ESD protection circuit 315 as a trigger signal for remaining ESD protection circuits.

Each of the first ESD protection circuit 311 to the fourth ESD protection circuit 314 includes a voltage clamp element, a trigger circuit section, and a surge detection circuit section. The fifth ESD protection circuit 315 includes a voltage clamp and trigger element, and a surge detection circuit section.

A configuration of the first ESD protection circuit 311 to the fourth ESD protection circuit 314 will now be described in detail.

In the first ESD protection circuit 311 to the fourth ESD protection circuit 314, the voltage clamp element includes a thyristor SCR composed of a PNP transistor QP and an NPN transistor QN. The thyristor SCR in the first ESD protection circuit 311 is connected between the VDD1 pad 211 and the GND1 pad 221 respectively at its anode and cathode. The same is true of other ESD protection circuits 312 to 314.

The thyristor SCR in the second ESD protection circuit 312 is connected between the VDD2 pad 212 and the GND2 pad 222 respectively at its anode and cathode. The thyristor SCR in the third ESD protection circuit 313 is connected between the VDD3 pad 213 and the GND3 pad 223 respectively at its anode and cathode. The thyristor SCR in the fourth ESD protection circuit 314 is connected between the I/O pad 27 and the GND3 pad 223 respectively at its anode and cathode.

In the first ESD protection circuit 311 to the fourth ESD protection circuit 314, the trigger circuit section includes a PMOS transistor TP1 for SCR trigger and an NMOS transistor TN for SCR trigger. In the trigger circuit section in the first ESD protection circuit 311, the PMOS transistor TP1 is connected between the VDD1 pad 211 and a base of the NPN transistor QN respectively at its source and drain, connected to a substrate region at its source, and connected to the trigger bias line 30 at its gate. The NMOS transistor TN is connected between a base of the PNP transistor QP and the GND1 pad 221 respectively at its drain and source, connected to a substrate region at its source, and connected to the trigger bias line 40 at its gate. The same is true of other ESD protection circuits 312 to 314.

In the trigger circuit section in the second ESD protection circuit 312, the PMOS transistor TP1 is connected between the VDD2 pad 212 and a base of the NPN transistor QN respectively at its source and drain, connected to a substrate region at its source, and connected to the trigger bias line 30 at its gate. The NMOS transistor TN is connected between a base of the PNP transistor QP and the GND2 pad 222 respectively at its drain and source, connected to a substrate region at its source, and connected to the trigger bias line 40 at its gate.

In the trigger circuit section in the third ESD protection circuit 313, the PMOS transistor TP1 is connected between the VDD3 pad 213 and a base of the NPN transistor QN respectively at its source and drain, connected to a substrate region at its source, and connected to the trigger bias line 30 at its gate. The NMOS transistor TN is connected between a base of the PNP transistor QP and the GND3 pad 223 respectively at its drain and source, connected to a substrate region at its source, and connected to the trigger bias line 40 at its gate.

In the trigger circuit section in the fourth ESD protection circuit 314, the PMOS transistor TP1 is connected between the I/O pad 27 and a base of the NPN transistor QN respectively at its source and drain, connected to a substrate region at its source, and connected to the trigger bias line 30 at its gate. The NMOS transistor TN is connected between a base of the PNP transistor QP and the GND3 pad 223 respectively at its drain and source, connected to a substrate region at its source, and connected to the trigger bias line 40 at its gate.

In the first ESD protection circuit 311 to the fourth ESD protection circuit 314, the surge detection circuit section includes a PMOS transistor TP2 for surge detection connected to a substrate region at its source, and a diode D connected in the forward direction in series with a source and a drain of the PMOS transistor TP2. In the surge detection circuit section in the first ESD protection circuit 311, the PMOS transistor TP2 for surge detection is connected to the VDD1 pad 211 at its source, connected to an anode of the diode D at its drain, and connected to the trigger bias line 30 at its gate. The diode D is connected to the trigger signal line 40 at its cathode. The same is true of the remaining ESD protection circuit 315.

In the surge detection circuit section in the second ESD protection circuit 312, the PMOS transistor TP2 for surge detection is connected to the VDD2 pad 212 at its source, connected to an anode of the diode D at its drain, and connected to the trigger bias line 30 at its gate. The diode D is connected to the trigger signal line 40 at its cathode.

In the surge detection circuit section in the third ESD protection circuit 313, the PMOS transistor TP2 for surge detection is connected to the VDD3 pad 213 at its source, connected to an anode of the diode D at its drain, and connected to the trigger bias line 30 at its gate. The diode D is connected to the trigger signal line 40 at its cathode.

In the surge detection circuit section in the second ESD protection circuit 314, the PMOS transistor TP2 for surge detection is connected to the I/O pad 27 at its source, connected to an anode of the diode D at its drain, and connected to the trigger bias line 30 at its gate. The diode D is connected to the trigger signal line 40 at its cathode.

In parallel with the SCR in each of the ESD protection circuits 311 to 314, a diode 32 for reverse current absorption is connected. When a reverse voltage is applied to the SCR, the diode 32 is forward biased to let flow a current opposite in direction to a current that flows through the SCR.

A configuration of the fifth ESD protection circuit 315 will now be described in detail.

In the fifth ESD protection circuit 315, the voltage clamp and trigger element includes an NMOS transistor TN. The NMOS transistor TN is connected between an output pad 28 and the GND3 pad 223 respectively at its drain and source, connected to a substrate region at its source, and connected to the trigger bias line 40 at its gate.

In the fifth ESD protection circuit 315, the surge detection circuit section includes a PMOS transistor TP2 for surge detection and a diode D connected between the output pad 28 and the trigger bias line 40. The PMOS transistor TP2 for surge detection is connected to a substrate region at its source, and the diode D is connected in a forward direction in series to the source-drain path of the PMOS transistor TP2. The PMOS transistor TP2 for surge detection is connected to the output pad 28 at its source, connected to an anode of the diode D at its drain, and connected to the trigger bias line 30 at its gate. The diode D is connected to the trigger signal line 40 at its cathode.

In other words, gates of the PMOS transistors TP2 for surge detection in the first ESD protection circuit ESD1 to the fifth ESD protection circuit ESD5 are connected to the trigger bias line 30 in common. Cathodes of the diodes D in the surge detection circuit sections are connected to the trigger signal line 40 in common.

A common discharge line 33 is connected directly to the GND1 pad 221. The common discharge line 33 is connected to the GND2 pad 222 via a parallel connection circuit composed of a forward parasitic diode element 34 and a backward parasitic diode element 35. Similarly, the common discharge line 33 is connected to the GND3 pad 223 via another parallel connection circuit composed of a forward parasitic diode element 34 and a backward parasitic diode element 35.

Further, a potential holding circuit 41 for keeping the potential on the trigger signal line 40 at the time of turning on the power supply of the device constant is connected between the trigger signal line 40 and the GND1 pad 221. The potential holding circuit 41 includes a capacitance element 42 connected between the trigger signal line 40 and the common discharge line 33 to hold charge, a resistor element 43 connected between the trigger signal line 40 and the common discharge line 33 to discharge the charge held across the capacitance element 42, and a voltage limiter element connected between the trigger signal line 40 and the common discharge line 33. The voltage limiter element includes a plurality of (two in the present embodiment) NMOS transistors 45 connected in series. Each of the NMOS transistors 45 is diode-connected. The resistor element 43 and the capacitance element 42 have a required time constant so as to function to prevent a trigger signal from occurring on the trigger signal line 40 when the power supply of the device is turned on.

Operation of the circuit shown in FIG. 1 will now be described.

In the circuit of FIG. 1, a node connected to gates of the PMOS transistors TP1 for SCR trigger and the PMOS transistors TP2 for surge detection in the ESD protection circuits 311 to 314 (i.e., an output node of the integration circuit 29 connected to the gates of the PMOS transistors TP1 and the PMOS transistors TP2 via the trigger bias line 30) has the highest potential VDD3 at the time of ordinary operation of the CMOS LSI, whereas it has the ground potential when the surge voltage input poses a problem (for example, before the use of the CMOS LSI).

In general, in such a state that the surge voltage input poses a problem, a normal power supply potential is not yet applied to each of the VDD1 pad 211 to the VDD3 pad 213, the trigger bias line 30 and the trigger signal line 40, and these pads and bias and signal lines have the ground potential.

When a surge voltage of positive polarity is input to, for example, the I/O pad 27, the PMOS transistor TP2 turns on, if a forward bias voltage greater in absolute value than a gate threshold voltage Vthp is applied between the gate and source of the PMOS transistor TP2 for surge detection in the ESD protection circuit 314. As a result, a trigger is applied to the thyristor SCR (voltage clamp element), and the thyristor SCR turns on. Thus, a surge current is discharged via the I/O pad 27 and the GND3 pad 223, and the I/O circuit 25 is protected.

At the same time, discharge (surge detection output) of the surge current in the ESD protection circuit 314 turns on the NMOS transistors TN (trigger elements) in other ESD protection circuits 311 to 313 and 315 via the trigger signal line 40. As a result, the thyristor SCRs (voltage clamp elements) in those other ESD protection circuits 311 to 313 and 315 turn on, and consequently clamping is effected between the VDD3 pad 213 and the GND3 pad 223 of a corresponding power supply system and between the output pad 28 and the GND3 pad 223. Thus, a low resistance current path is formed before a surge current flows. Internal circuits connected between power supply terminals and ground terminals of power supply systems are thus protected.

In such a state that the surge voltage input poses a problem, when a surge voltage of positive polarity is input to the output pad 28, a trigger is applied to the NMOS transistor TN (a voltage clamp and trigger element) of the ESD protection circuit 315. As a result, the NMOS transistor TN turns on, and thus, a surge current is discharged via the output pad 28 and the GND3 pad 223, and the output buffer circuit 26 is protected.

At the same time, discharge (surge detection output) of the surge current in the ESD protection circuit 315 turns on the NMOS transistors TN (trigger elements) in other ESD protection circuits 311 to 314 via the trigger signal line 40. As a result, the thyristor SCRs (voltage clamp elements) in those other ESD protection circuits 311 to 314 turn on, and consequently clamping is effected between the power supply pad and the GND pad of a corresponding power supply system and between the I/O pad 27 and the GND3 pad 223. Thus, a low resistance current path is formed before a surge current flows. Internal circuits connected between power supply terminals and ground terminals of power supply systems are thus protected.

According to the electrostatic discharge protection circuit device in the first embodiment, it becomes unnecessary to incorporate ESD protection circuits between power supply pads and between signal pads in the semiconductor device using multiple power supplies. As a result, it becomes possible to remarkably reduce the area occupied by the pattern of the ESD protection circuits on the chip, and reduce the chip size.

In the operation described above, a triggered thyristor SCR is kept in the on-state by its own positive feedback operation. Therefore, the PMOS transistor TP1 for trigger input needs to be in the on-state only for a short time immediately after the application of the surge input and before the thyristor SCR is triggered. Moreover, since the absolute value of the gate threshold voltage Vthp in the PMOS transistor TP1 for trigger input is small, it becomes possible to start the thyristor SCR by using a low voltage trigger.

A plurality of typical models for the surge input source and their surge input waveforms will now be described briefly.

Figure 2A:
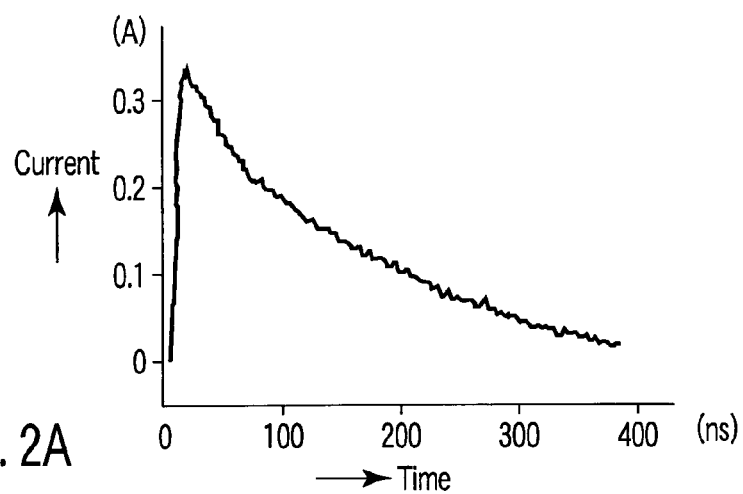
FIG. 2A is a diagram showing an example of a surge input waveform obtained when a surge input source is a human body model (HBM)

FIG. 2A shows a surge input waveform in the case of a human body model (HBM). In this case, the surge input waveform is a single small-current waveform.

Figure 2B:
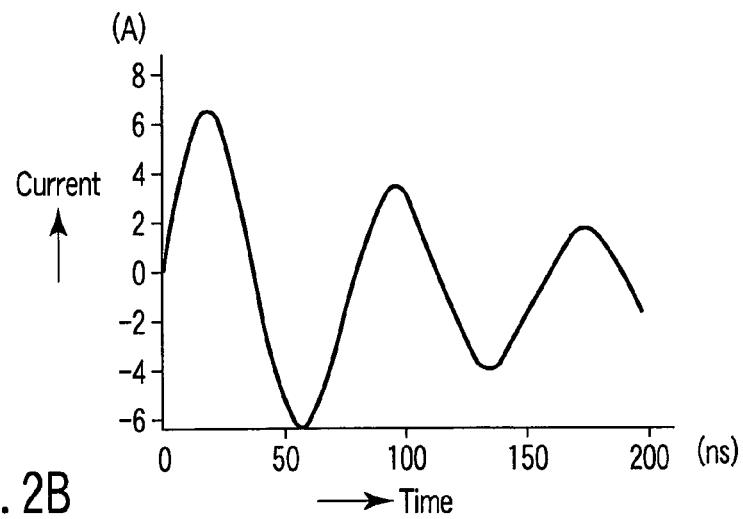
FIG. 2B is a diagram showing an example of a surge input waveform obtained when a surge input source is a machine model (MM)

FIG. 2B shows a surge input waveform in the case of a machine model (MM). In this case, the surge input waveform is a medium-current oscillating waveform that is bipolar (i.e., the polarity of the surge input is inverted alternately).

Figure 2C:
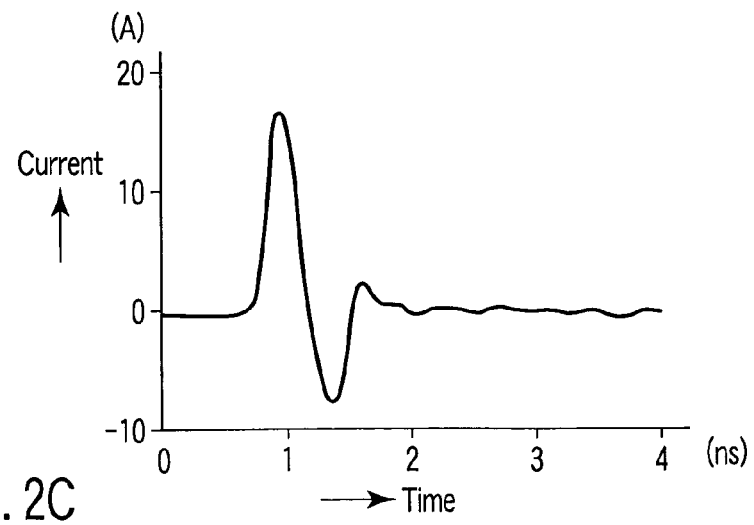
FIG. 2C is a diagram showing an example of a surge input waveform obtained when a surge input source is a charged device model (CDM)

FIG. 2C shows a surge input waveform in the case of a charged device model (CDM). In this case, the surge input waveform is a fast large-current bipolar oscillating waveform.

Figure 3:
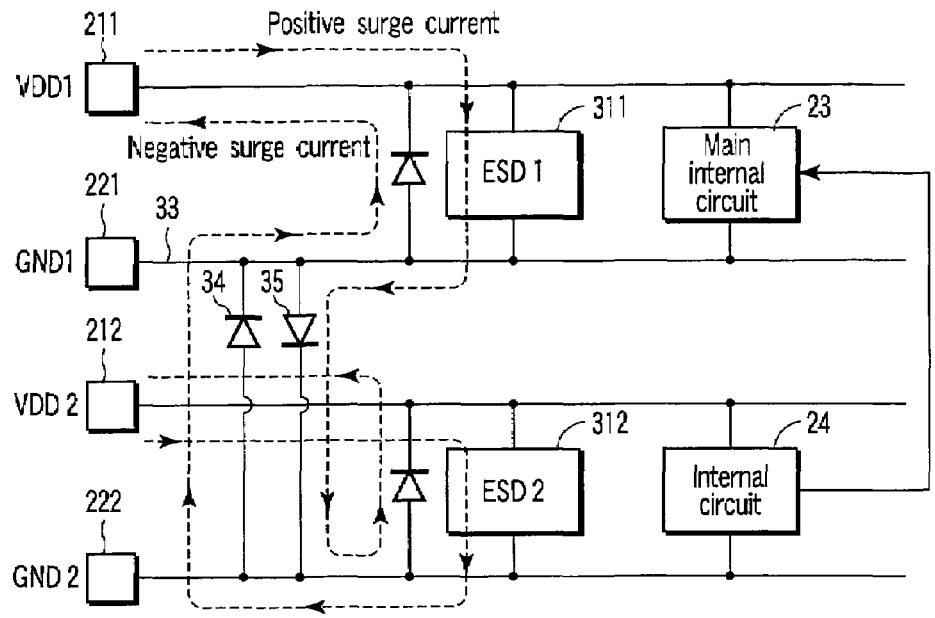
FIG. 3 is a circuit diagram of a part taken out from the circuit shown in FIG. 1 in order to show operation of the circuit in the machine model (MM)
Figure 4:
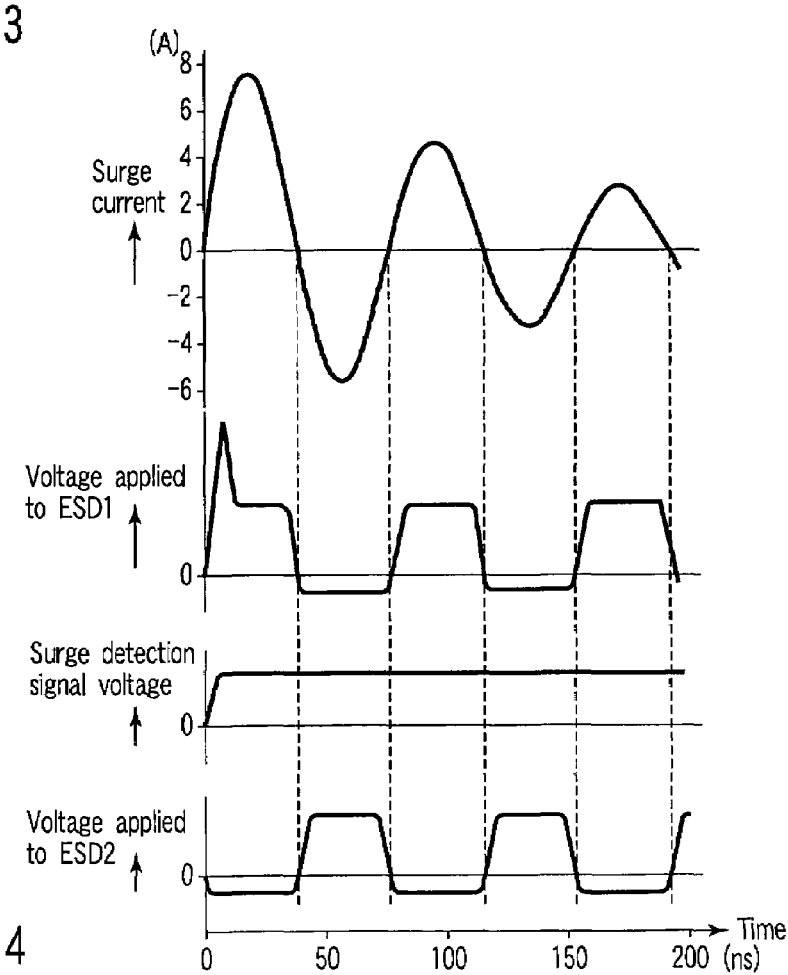
FIG. 4 is a waveform diagram showing an example of an operation waveform of the circuit shown in FIG. 3 in the machine model (MM)

FIG. 3 is a circuit diagram of a part taken out from the circuit shown in FIG. 1 in order to show operation of the circuit in the machine model (MM). FIG. 4 is a waveform diagram showing an example of an operation waveform of the circuit shown in FIG. 3 in the machine model (MM).

In the case where the surge voltage input of the machine model (MM) is applied between the VDD1 pad 211 and the VDD2 pad 212 in the circuit shown in FIG. 3, the ESD protection circuit 311 turns on, when a surge voltage of positive polarity has been input. Thus, a positive surge current (plus current) flows through a route shown in FIG. 3, and clamps the surge voltage. Therefore, main internal circuits 23 are protected. Thereafter, when a surge voltage of a reverse polarity is input to any one of the VDD2 pad, the VDD3 pad, the I/O pad 27 and the output pad 28, a negative surge current (minus current) is discharged through a route shown in FIG. 3 and the surge voltage is clamped. Therefore, corresponding internal circuits (in the present example, internal circuits 24 connected between the VDD2 pad 212 and the GND2 pad 222 are shown) are protected.

According to the electrostatic discharge protection circuit device in the first embodiment, it becomes possible to implement favorite protection characteristics and improve the reliability, not only when the surge input source is a human body model (HBM) but also when the surge input source is a machine model (MM) or a charged device model (CDM). Thus the electrostatic discharge protection circuit device in the first embodiment is extremely effective.

In the case where the electrostatic discharge protection circuit device in the first embodiment is applied to an actual LSI (such as an ASIC), it becomes necessary to adjust a threshold of a transistor. However, the threshold of the transistor can be changed by changing the channel width W/the channel length L. Therefore, the electrostatic discharge protection circuit device in the first embodiment has a high degree of freedom in design, and it is suitable for application to an actual LSI (such as an ASIC).

It is desirable to previously set ESD protection circuits shown in the first embodiment to the protection operation state until an LSI incorporating the ESD protection circuits is mounted on a circuit board of an application product. Thus, a configuration is added so as to set ESD protection circuits to the protection operation state by means of an external signal supplied from outside to the LSI, circuit setting within the LSI, or the like. Three examples of such a configuration will be described hereafter.

FIRST EXAMPLE

Figure 5:
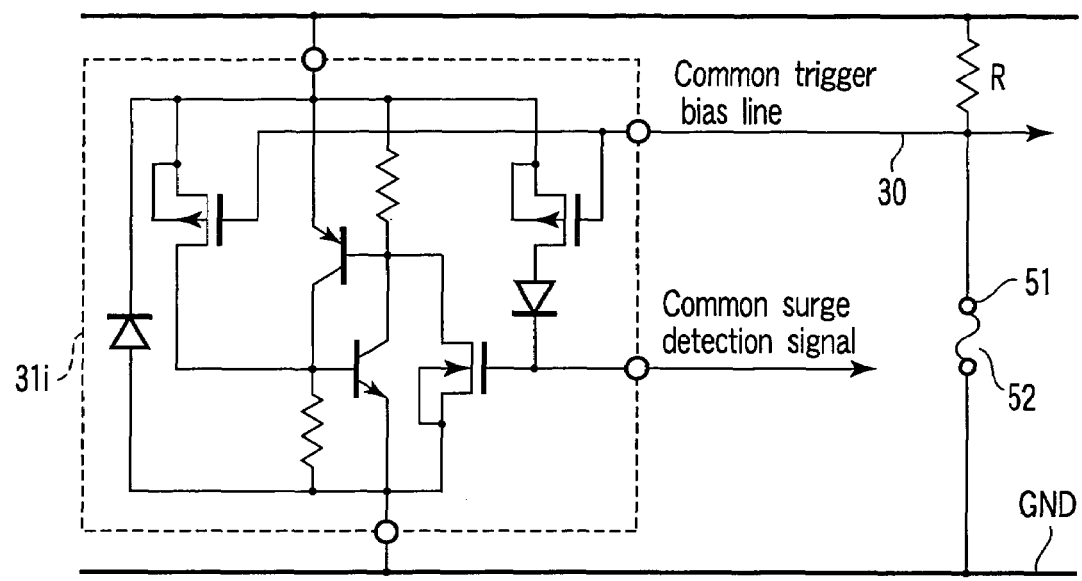
FIG. 5 is a circuit diagram showing a part of a CMOS LSI obtained by adding a configuration for making it possible to set ESD protection circuits to a protection operation state in response to an external signal, to the CMOS LSI shown in FIG. 1.

FIG. 5 shows a part of a CMOS LSI obtained by adding a configuration for making it possible to set ESD protection circuits to the protection operation state in response to an external signal, to the CMOS LSI shown in FIG. 1.

In FIG. 5, reference numeral 31*i* denotes representative one of a plurality of ESD protection circuits (ESDs).

An external terminal 52 is connected to the trigger bias line 30 (one end of R in the integration circuit 29) connected to the ESD protection circuit 31*i*. A fuse element 52 connected to the external terminal 51 and the ground line GND at its ends is formed within the LSI.

If the fuse element 52 is in the on-state (initial state), the trigger bias line 30 is at the ground potential and the ESD protection circuit 31*i* is set to the on-state (protection operation state). After the LSI is mounted on a circuit board of an application product, a fuse blowing-out current is supplied from the outside of the LSI so as to flow from the external terminal 51 to the ground line GND to bring the fuse element 52 in the off-state. In the off-state, operation similar to that in the first embodiment becomes possible.

SECOND EXAMPLE

Figure 6:
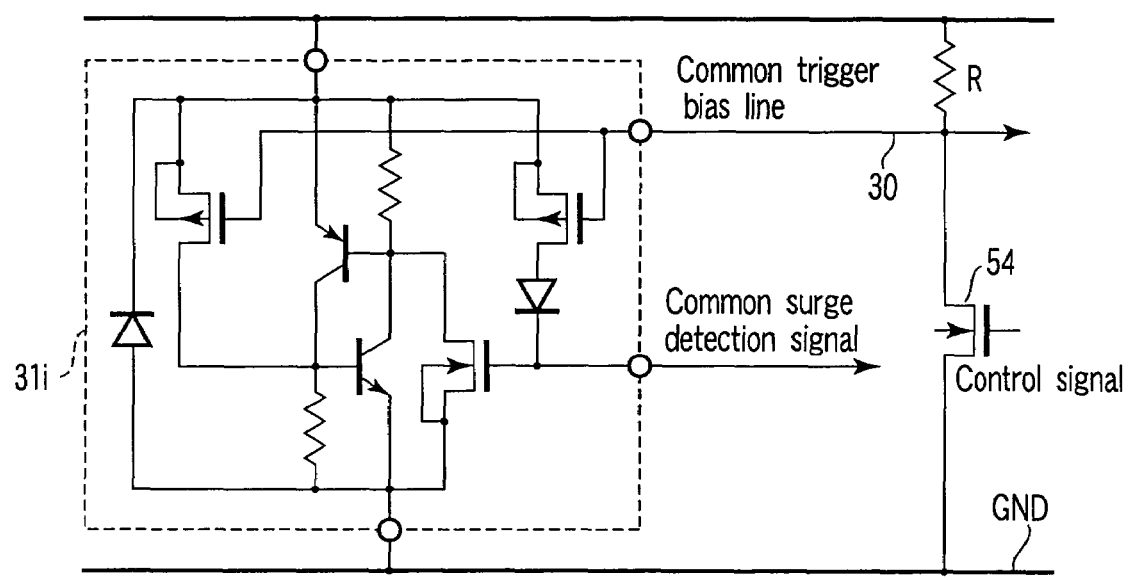
FIG. 6 is a circuit diagram showing a part of a CMOS LSI obtained by adding a configuration for making it possible to set ESD protection circuits to a protection operation state on the basis of setting within a CMOS LSI, to the CMOS LSI shown in FIG. 1.

FIG. 6 shows a part of a CMOS LSI obtained by adding a configuration for making it possible to set ESD protection circuits to the protection operation state by setting the circuit in the LSI, to the CMOS LSI shown in FIG. 1.

In FIG. 6, reference numeral 31*i* denotes representative one of a plurality of ESD protection circuits (ESDs).

In FIG. 6, a switch element (such as, for example, a MOSFET) 54, which is connected between the trigger bias line connected to the ESD protection circuit 31*i* and a ground line GND, is formed within the LSI. The switch element 54 is controlled to turn on or off by a switch control signal supplied from the outside of the LSI or the inside of the LSI.

If the switch element 54 is controlled to be in the on-state, then the trigger bias line 30 is at the ground potential and the ESD protection circuit 31*i* is set to the on-state (protection operation state).

After the LSI is mounted on a circuit board of an application product, the switch element 54 is controlled to be off-state. In the off-state, operation similar to that in the first embodiment becomes possible.

Such a configuration that the switch element 54 is controlled to switch by using means such as an electrically erasable and rewritable nonvolatile memory cell (EEPROM) is also possible.

THIRD EXAMPLE

Figure 7:
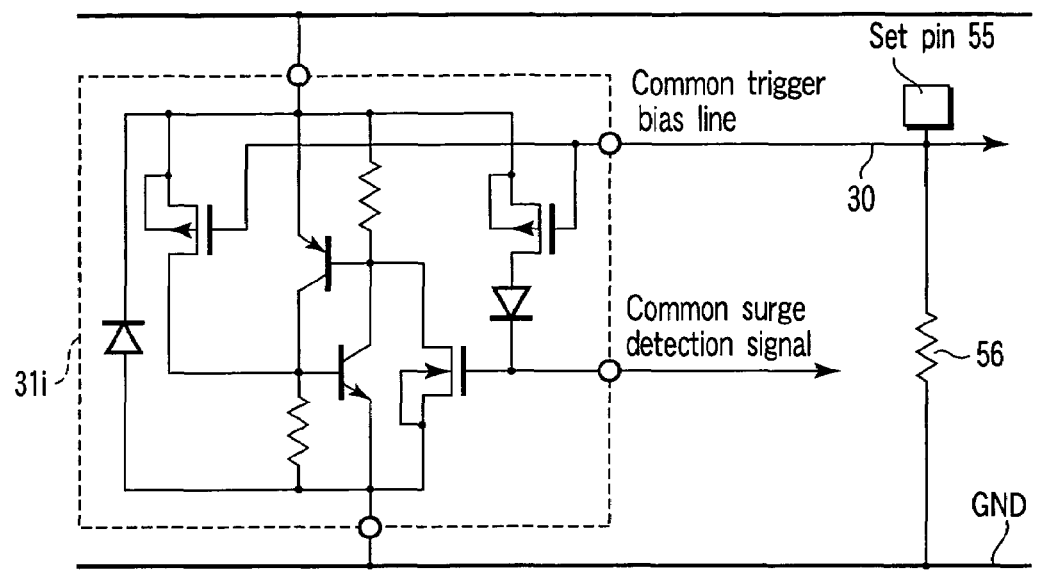
FIG. 7 is a circuit diagram showing a part of a CMOS LSI obtained by adding a configuration for making it possible to set ESD protection circuits to a protection operation state when mounting a CMOS LSI, to the CMOS LSI shown in FIG. 1.

FIG. 7 shows a part of a CMOS LSI obtained by adding a configuration for making it possible to set ESD protection circuits to the protection operation state until the CMOS LSI is mounted, to the CMOS LSI shown in FIG. 1.

In FIG. 7, reference numeral 31*i* denotes representative one of a plurality of ESD protection circuits (ESDs).

In FIG. 7, an external setting terminal 55 is connected to the trigger bias line 30 connected to the ESD protection circuit 31*i*. A high-resistance terminal 56 for pull down electrically connected between the external setting terminal 55 and a ground line is formed within the LSI.

In the initial state, the trigger bias line 30 is at the ground potential and the ESD protection circuit 31*i* is set to the on-state (protection operation state). When the LSI is mounted on a circuit board of an application product, the external setting terminal 55 is connected to a power supply wiring pattern on the circuit board. In this state, since the trigger bias line 30 becomes the power supply potential, operation similar to that in the first embodiment becomes possible.

<Second Embodiment>

In the first embodiment, the AC trigger method is used. In the AC trigger method, an AC surge input is detected by a certain ESD protection circuit, and other remaining ESD protection circuits are triggered by a voltage obtained by holding a result of the detection in the holding circuit. However, the trigger method is not limited to the AC trigger method. It is also possible to use a DC trigger method jointly. If an AC surge input is detected by a certain ESD protection circuit, then other remaining ESD protection circuits are triggered by a DC voltage at a node within the protection circuit. Hereafter, an example thereof will be described.

Figure 8:
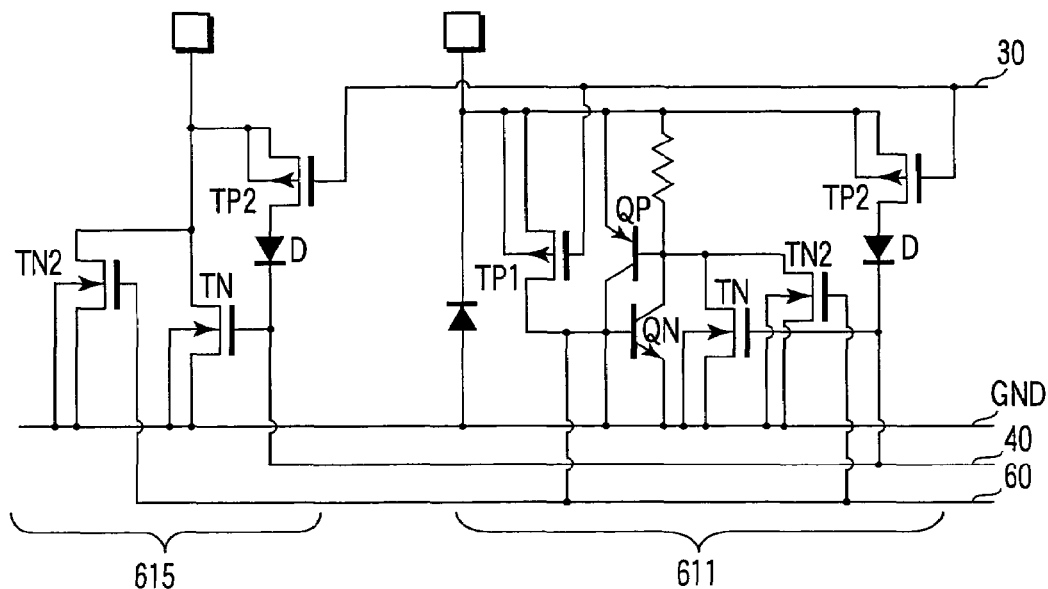
FIG. 8 is a circuit diagram showing a part of a CMOS LSI obtained by adding a configuration using a DC trigger method jointly, to the CMOS LSI according to the first embodiment, as a CMOS LSI according to a second embodiment of the present invention.
Figure 9:
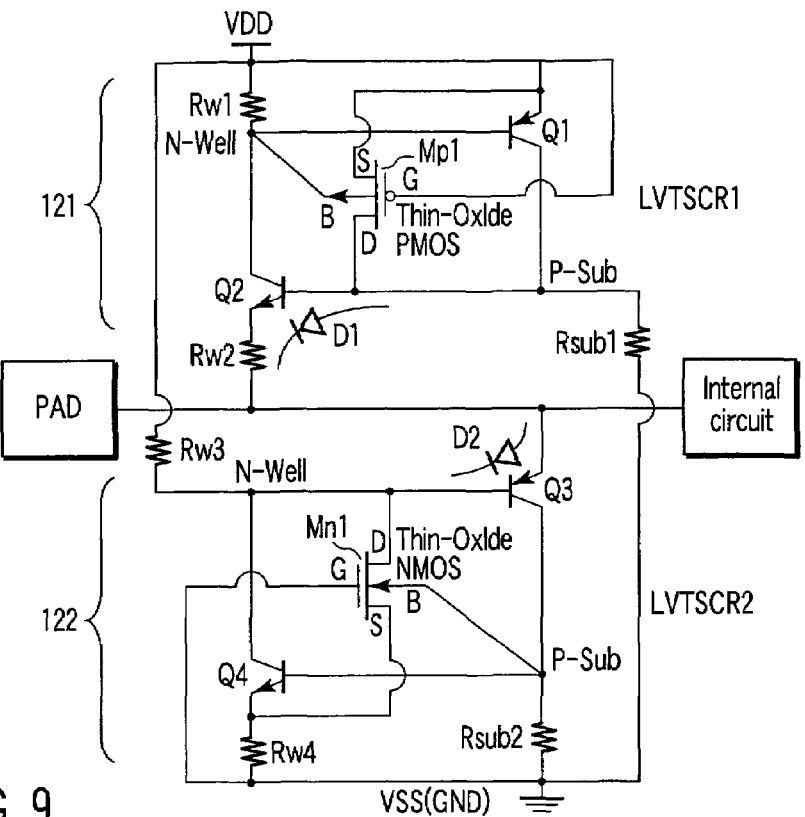
FIG. 9 is an equivalent circuit diagram showing a conventional-art example 1 of ESD protection circuits using SCRs connected to an input circuit of a CMOS LSI.
Figure 10:
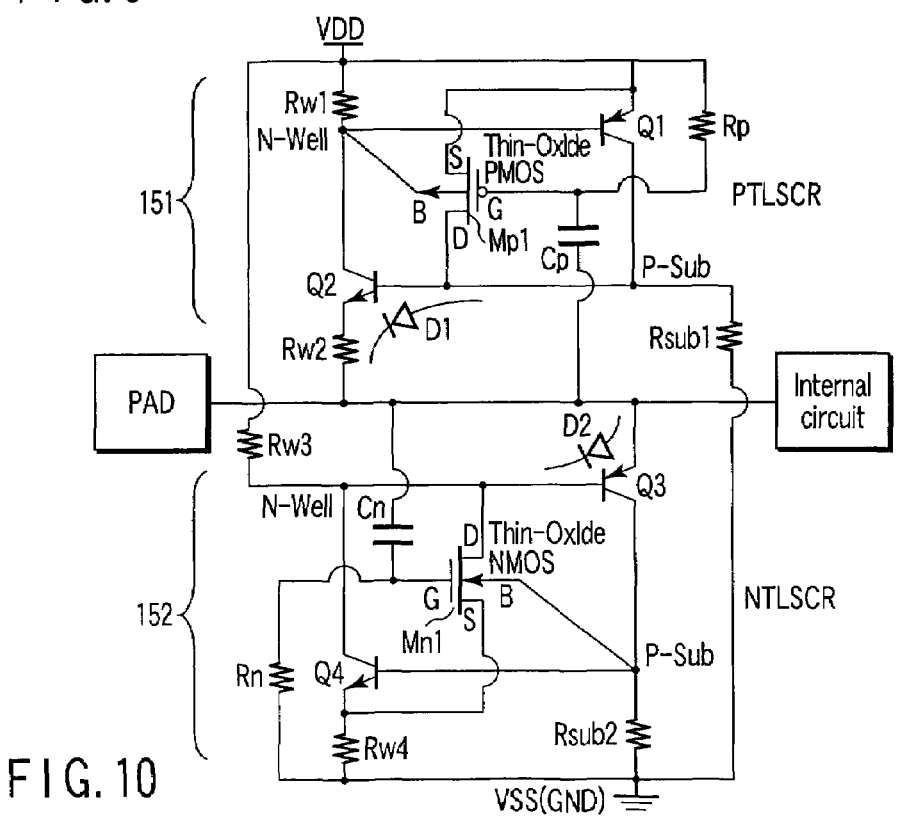
FIG. 10 is an equivalent circuit diagram showing a conventional-art example 2 of ESD protection circuits using SCRs connected to an input circuit of a CMOS LSI.
Figure 11:
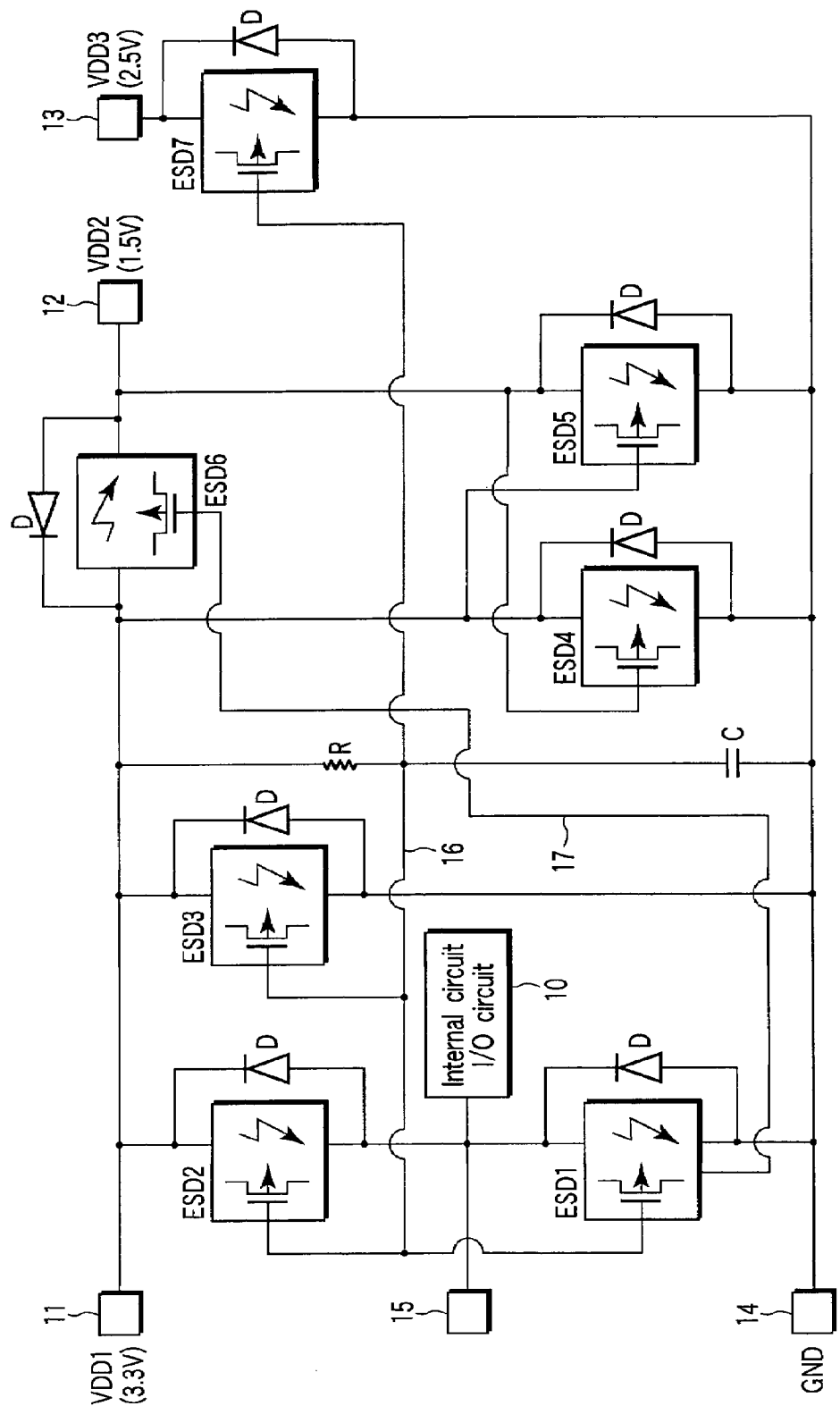
FIG. 11 is a circuit diagram showing an example of application of ESD protection circuits using SCRs in a CMOS LSI according to an example of a semiconductor device.

FIG. 8 shows a part of a CMOS LSI according to a second embodiment of the present invention, which is obtained by adding a configuration using a DC trigger method jointly, to a CMOS LSI according to a first embodiment.

In FIG. 8, reference numeral 611 denotes one of a plurality of ESD protection circuits (ESDs) each using an SCR as a voltage clamp element. The ESD protection circuit 611 differs from the ESD protection circuits 311 to 314 in the first embodiment in that an NMOS transistor TN2 for DC trigger connected in parallel with and so as to be associated with the NMOS transistor TN for SCR trigger is added. Since other components in the ESD protection circuit 611 are the same as those in the ESD protection circuits 311 to 314 in the first embodiment shown in FIG. 1, and thus denoted by like characters.

Similarly, reference numeral 615 denotes one of a plurality of ESD protection circuits (ESDs) each using a voltage clamp and trigger element TN. The ESD protection circuit 615 differs from the ESD protection circuit 315 in the first embodiment in that an NMOS transistor TN2 for DC trigger connected in parallel with and so as to be associated with the trigger element TN is added. Since other components in the ESD protection circuit 615 are the same as those in the ESD protection circuit 315 in the first embodiment shown in FIG. 1, and thus denoted by like characters.

Paying attention to the fact that the base potential of the NPN transistor QN of the SCR in each of the ESD protection circuits 611 rises at the time of surge detection, a DC trigger line 60 is provided so as to connect the base of the NPN transistor QN of the SCR in each of the ESD protection circuits 611 and gates of the NMOS transistors TN2 for DC trigger in all ESD protection circuits 611 and 615 to each other.

According to the configuration, when surge is detected by an ESD protection circuit included in a plurality of ESD protection circuits each using an SCR as the voltage clamp element, the base potential (DC potential) of the NPN transistor QN in the SCR rises and the DC potential is transferred to other remaining ESD protection circuits 611 and 615 via the DC trigger line 60 as a trigger signal.

By jointly using the AC trigger operation using the trigger signal line 40 and the DC trigger operation using the DC trigger signal line 60, therefore, the trigger operation for the SCR is surely conducted and the ESD protection operation is surely conducted.

When applying ESD protection circuits using SCRs to LSIs advanced in lowering the power supply voltage, the semiconductor devices in the embodiments of the present invention makes it possible to implement favorable protection characteristics with a low voltage trigger and improve the reliability as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electrostatic discharge protection circuit device comprising:
    a first electrostatic discharge protection circuit connected between a first external terminal supplied with a first power supply voltage at time of ordinary operation and a first ground terminal;
    a second electrostatic discharge protection circuit connected between a second external terminal supplied with a second power supply voltage at the time of the ordinary operation and a second ground terminal, the second electrostatic discharge protection circuit having substantially the same configuration as that of the first electrostatic discharge protection circuit;
    a trigger signal line which connects in common an output node of surge detection circuits of the first and second electrostatic discharge protection circuits, and transfers a surge detection output of one of the first and second electrostatic discharge protection circuits to the other electrostatic discharge protection circuit as a trigger signal; and
    a common discharge line connected directly to the first ground terminal, connected to the second ground terminal via a parallel circuit composed of a forward-connected parasitic diode element and a reverse-connected parasitic diode element, and used commonly by the first and second of electrostatic discharge protection circuits.

2. The electrostatic discharge protection circuit device according to claim 1, wherein each of the first electrostatic discharge protection circuit and the second electrostatic discharge protection circuit comprises a voltage clamp element, a trigger circuit, and a surge detection circuit.

3. The electrostatic discharge protection circuit device according to claim 2, wherein
the voltage clamp element comprises an SCR for ESD protection composed of a PNP transistor and an NPN transistor, the SCR being connected between the external terminal and ground terminal associated therewith respectively at an anode and a cathode of the SCR,
the trigger circuit comprises a first PMOS transistor for SCR trigger connected between the external terminal associated therewith and the base of the NPN transistor respectively at a source and a drain thereof, connected to a substrate region at the source thereof, and connected to a trigger bias line, and an NMOS transistor for SCR trigger connected between a base of the PNP transistor and the ground terminal associated therewith respectively at a drain and a source thereof, connected to a substrate region at the source thereof, and connected to the trigger signal line at a gate thereof, and
the surge detection circuit comprises a second PMOS transistor for surge detection inserted between the external terminal associated therewith and the trigger signal line and connected to a substrate region at the source thereof, and a diode connected in series with the second PMOS transistor in a forward direction.

4. The electrostatic discharge protection circuit device according to claim 2, further comprising a third electrostatic discharge protection circuit which includes a voltage clamp and trigger element, connected between a third external terminal for signal input/output electrically isolated from the first external terminal and the second ground terminal, and a second surge detection circuit, an output node of the second surge detection circuit being connected to the trigger signal line.

5. The electrostatic discharge protection circuit device according to claim 4, wherein
the voltage clamp and trigger element comprises an NMOS transistor connected between the third external terminal and the second ground terminal respectively at a drain and a source thereof, connected to a substrate region at the source thereof, and connected to the trigger signal line at a gate thereof, and
the second surge detection circuit comprises a second PMOS transistor for surge detection inserted between the third external terminal and the trigger signal line and connected to a substrate region at the source thereof, and a diode connected in series with the second PMOS transistor in a forward direction.

6. The electrostatic discharge protection circuit device according to claim 1, further comprising:
an integration circuit connected between the first or second external terminal supplied with a highest potential of those potentials supplied to the first external terminal and the second external terminal and the ground terminal associated with the external terminal supplied with the highest potential, and
a trigger bias line connected in common to an output node of the integration circuit and to gates of surge detection elements and trigger elements in the first and second electrostatic discharge protection circuits.

7. The electrostatic discharge protection circuit device according to claim 1, further comprising a potential holding circuit connected to the trigger signal line to keep a potential on the trigger signal line at time when a power supply of the circuit device is turned on constant.

8. The electrostatic discharge protection circuit device according to claim 7, wherein the potential holding circuit comprises:

a capacitance element connected to the trigger signal line, which holds electric charges;
a resistor element which determines a time constant in cooperation with the capacitance element so as to prevent the trigger signal from being generated at the time when the power supply of the circuit device is turned on and discharges electric charges held by the capacitance element, the resistor element being connected to the trigger signal line; and
a voltage limiter element connected to the trigger signal line.

9. The electrostatic discharge protection circuit device according to claim 6, wherein each of the first and second electrostatic discharge protection circuits has a configuration in which each of the first and second electrostatic discharge protection circuits is set to a protection operation state by an external signal supplied from outside of a semiconductor integrated circuit device incorporating the first and second electrostatic discharge protection circuits.

10. The electrostatic discharge protection circuit device according to claim 6, wherein each of the first and second electrostatic discharge protection circuits has a configuration in which each of the first and second electrostatic discharge protection circuits is set to a protection operation state by setting a circuit in a semiconductor integrated circuit device incorporating the first and second electrostatic discharge protection circuits.

11. The electrostatic discharge protection circuit device according to claim 9, further comprising a fuse element connected between the trigger bias line and a ground terminal in the semiconductor integrated circuit device,
wherein the fuse element is blown out from the outside of the semiconductor integrated circuit device after the semiconductor integrated circuit device is mounted on a circuit board of an application product.

12. The electrostatic discharge protection circuit device according to claim 10, further comprising a switch element connected between the trigger bias line and a ground terminal in the semiconductor integrated circuit device,
wherein the switch element is controlled to be in an on-state until the semiconductor integrated circuit device is mounted on a circuit board of an application product, and the switch element is controlled to be in an off-state after the semiconductor integrated circuit device is mounted on the circuit board of the application product.

13. The electrostatic discharge protection circuit device according to claim 10, further comprising:
an external setting terminal connected to the trigger bias line; and
a pull-down resistor element between the external setting terminal and a ground line within the semiconductor integrated circuit device,
wherein the external setting terminal is connected to a power supply wiring pattern on the circuit board when the semiconductor integrated circuit device has been mounted on a circuit board of an application product.

14. The electrostatic discharge protection circuit device according to claim 3, further comprising:
first and second NMOS transistors for DC trigger associated with and connected in parallel to the NMOS transistor for trigger included in the first electrostatic protection circuit and the NMOS transistor for trigger included in the second electrostatic protection circuit, respectively; and
a DC trigger line which transfers a base potential at an NPN transistor in the SCR in one of the first and second electrostatic protection circuits to a gate of the NMOS transistor for DC trigger in the other electrostatic protection circuit.

15. The electrostatic discharge protection circuit device according to claim 3, further comprising:
a third electrostatic discharge protection circuit which includes a voltage clamp and trigger element, connected between a third external terminal for signal input/output electrically isolated from the first external terminal and the second ground terminal, and a second surge detection circuit, an output node of the second surge detection circuit being connected to the trigger signal line,
first and second NMOS transistors for DC trigger associated with and connected in parallel to the NMOS transistor for trigger included in the first electrostatic protection circuit and the NMOS transistor for trigger included in the second electrostatic protection circuit, respectively;
a third NMOS transistor for DC trigger associated with and connected in parallel to an NMOS transistor for voltage clamp and trigger included in the third electrostatic protection circuit; and
a DC trigger line which transfers a base potential at an NPN transistor in the SCR in one of the first, second and third electrostatic protection circuits to a gate of the NMOS transistor for DC trigger in the other electrostatic protection circuits.

16. An electrostatic discharge protection circuit device comprising:
a first electrostatic discharge protection circuit connected between a first external terminal supplied with a first power supply voltage at time of ordinary operation and a first ground terminal;
a plurality of second electrostatic discharge protection circuits each connected between a corresponding second external terminal supplied with a corresponding second power supply voltage at the time of the ordinary operation and a corresponding second ground terminal, each of the second electrostatic discharge protection circuits having substantially the same configuration as that of the first electrostatic discharge protection circuit;
a trigger signal line which connects in common an output node of a surge detection circuit of the first electrostatic discharge protection circuit and output nodes of surge detection circuits of the second electrostatic discharge protection circuits, and transfers a surge detection output of the first electrostatic discharge protection circuit and a surge detection output of one of the second electrostatic discharge protection circuits to the other electrostatic discharge protection circuits as a trigger signal; and
a common discharge line connected directly to the first ground terminal, connected to the second ground terminals via a parallel circuit composed of a forward-connected parasitic diode element and a reverse-connected parasitic diode element, and used commonly by the first electrostatic discharge protection circuit and the second of electrostatic discharge protection circuits.

17. The electrostatic discharge protection circuit device according to claim 16, wherein the first electrostatic discharge protection circuit and each of the second electrostatic discharge protection circuits comprise a voltage clamp element, a trigger circuit, and a surge detection circuit.

18. The electrostatic discharge protection circuit device according to claim 17, wherein
the voltage clamp element comprises an SCR for ESD protection composed of a PNP transistor and an NPN transistor, the SCR being connected between the external terminal to which the corresponding electrostatic discharge protection circuit is connected and the ground terminal associated therewith respectively at an anode and a cathode of the SCR,
the trigger circuit comprises a first PMOS transistor for SCR trigger connected between the external terminal to which the corresponding electrostatic discharge protection circuit is connected and the base of the NPN transistor respectively at a source and a drain thereof, connected to a substrate region at the source thereof, and connected to a trigger bias line, and an NMOS transistor for SCR trigger connected between a base of the PNP transistor and the ground terminal to which the corresponding electrostatic discharge protection circuit is connected respectively at a drain and a source thereof, connected to a substrate region at the source thereof, and connected to the trigger signal line at a gate thereof, and
the surge detection circuit comprises a second PMOS transistor for surge detection inserted between the external terminal to which the corresponding electrostatic discharge protection circuit is connected and the trigger signal line and connected to a substrate region at the source thereof, and a diode connected in series with the second PMOS transistor in a forward direction.

19. The electrostatic discharge protection circuit device according to claim 17, further comprising a third electrostatic discharge protection circuit which includes a voltage clamp and trigger element, connected between a third external terminal for signal input/output electrically isolated from the first external terminal and one of the second ground terminals, and a second surge detection circuit, an output node of the second surge detection circuit being connected to the trigger signal line.

20. The electrostatic discharge protection circuit device according to claim 19, wherein
the voltage clamp and trigger element comprises an NMOS transistor connected between the third external terminal and the one of the second ground terminals respectively at a drain and a source thereof, connected to a substrate region at the source thereof, and connected to the trigger signal line at a gate thereof, and
the second surge detection circuit comprises a second PMOS transistor for surge detection inserted between the third external terminal and the trigger signal line and connected to a substrate region at the source thereof, and a diode connected in series with the second PMOS transistor in a forward direction.

21. The electrostatic discharge protection circuit device according to claim 16, further comprising:
an integration circuit connected between the first external terminal or one of the second external terminals supplied with a highest potential of those potentials supplied to the first external terminal and the second external terminals, and the ground terminal associated with the external terminal supplied with the highest potential, and
a trigger bias line connected in common to an output node of the integration circuit and to gates of surge detection elements and trigger elements in the first electrostatic discharge protection circuit and the second electrostatic discharge protection circuits.

22. The electrostatic discharge protection circuit device according to claim 16, further comprising a potential holding circuit connected to the trigger signal line to keep a potential on the trigger signal line at time when a power supply of the circuit device is turned on constant.

23. The electrostatic discharge protection circuit device according to claim 22, wherein the potential holding circuit comprises:
   a capacitance element connected to the trigger signal line, which holds electric charges;
   a resistor element which determines a time constant in cooperation with the capacitance element so as to prevent the trigger signal from being generated at the time when the power supply of the circuit device is turned on and discharges electric charges held by the capacitance element, the resistor element being connected to the trigger signal line; and
   a voltage limiter element connected to the trigger signal line.

24. The electrostatic discharge protection circuit device according to claim 21, wherein the first electrostatic discharge protection circuit and each of the second electrostatic discharge protection circuits have a configuration in which the first electrostatic discharge protection circuit and each of the second electrostatic discharge protection circuits are set to a protection operation state by an external signal supplied from outside of a semiconductor integrated circuit device incorporating the first electrostatic discharge protection circuit and the second electrostatic discharge protection circuits.

25. The electrostatic discharge protection circuit device according to claim 21, wherein the first electrostatic discharge protection circuit and each of the second electrostatic discharge protection circuits have a configuration in which the first electrostatic discharge protection circuit and each of the second electrostatic discharge protection circuits are set to a protection operation state by setting a circuit in a semiconductor integrated circuit device incorporating the first electrostatic discharge protection circuit and the second electrostatic discharge protection circuits.

26. The electrostatic discharge protection circuit device according to claim 24, further comprising a fuse element connected between the trigger bias line and a ground terminal in the semiconductor integrated circuit device,
   wherein the fuse element is blown out from the outside of the semiconductor integrated circuit device after the semiconductor integrated circuit device is mounted on a circuit board of an application product.

27. The electrostatic discharge protection circuit device according to claim 25, further comprising a switch element connected between the trigger bias line and the one of the ground terminals in the semiconductor integrated circuit device,
   wherein the switch element is controlled to be in an on-state until the semiconductor integrated circuit device is mounted on a circuit board of an application product, and the switch element is controlled to be in an off-state after the semiconductor integrated circuit device is mounted on the circuit board of the application product.

28. The electrostatic discharge protection circuit device according to claim 25, further comprising:
   an external setting terminal connected to the trigger bias line; and
   a pull-down resistor element between the external setting terminal and a ground line within the semiconductor integrated circuit device,
   wherein the external setting terminal is connected to a power supply wiring pattern on the circuit board when the semiconductor integrated circuit device has been mounted on a circuit board of an application product.

29. The electrostatic discharge protection circuit device according to claim 16, wherein
   a plurality of electrostatic discharge protection circuits including the first electrostatic discharge protection circuit and the second electrostatic discharge protection circuits and having the substantially same configuration as that of the first electrostatic discharge protection circuit and each of the second electrostatic discharge protection circuits are formed in a semiconductor integrated circuit device, and
   an output of a surge detection circuit of the electrostatic discharge protection circuit among the plurality of electrostatic discharge protection circuits that has first detected that electrostatic charge has been applied is supplied to other electrostatic discharge protection circuits via the trigger signal line as a trigger input.

30. The electrostatic discharge protection circuit device according to claim 19, further comprising:
   a plurality of NMOS transistors for DC trigger associated with and connected in parallel to the NMOS transistors for trigger included in the first electrostatic protection circuit and the second electrostatic protection circuits; and
   a DC trigger line which transfers a base potential at the NPN transistor in the SCR in one of the electrostatic protection circuits to gates of the NMOS transistors for DC trigger in other electrostatic protection circuits.

31. The electrostatic discharge protection circuit device according to claim 19, further comprising:
   a third electrostatic discharge protection circuit which includes a voltage clamp and trigger element, connected between a third external terminal for signal input/output electrically isolated from the first external terminal and one of the second ground terminals, and a second surge detection circuit, an output node of the second surge detection circuit being connected to the trigger signal line,
   a plurality of NMOS transistors for DC trigger associated with and connected in parallel to the NMOS transistors for trigger included in the first and second electrostatic protection, circuits;
   a NMOS transistor for voltage clamp and trigger included in the third electrostatic protection circuit; and
   a DC trigger line which transfers a base potential at the NPN transistor in the SCR in the first electrostatic protection circuit and one of the second electrostatic protection circuits to gates of the NMOS transistors for DC trigger in other electrostatic protection circuits.

* * * * *